United States Patent [19]
Ebinuma et al.

[11] Patent Number: 5,317,615
[45] Date of Patent: May 31, 1994

[54] EXPOSURE APPARATUS

[75] Inventors: Ryuichi Ebinuma, Kawasaki; Nobutoshi Mizusawa, Yamato; Takao Kariya, Hino; Shigeyuki Suda, Yokohama, all of; Shunichi Uzawa, Nakamachi; Takayuki Hasegawa, Yokohama, all of Japan

[73] Assignee: Canon Kabushiki Kaisha, Tokyo, Japan

[21] Appl. No.: 987,554

[22] Filed: Dec. 8, 1992

Related U.S. Application Data

[63] Continuation of Ser. No. 662,408, Feb. 28, 1991, abandoned.

[30] Foreign Application Priority Data

Mar. 2, 1990 [JP] Japan ................................ 2-49583
May 10, 1990 [JP] Japan ................................ 2-118680

[51] Int. Cl.⁵ ............................................. G21K 5/00
[52] U.S. Cl. ................................. 378/34; 378/207
[58] Field of Search ............................. 378/34, 207

[56] References Cited

U.S. PATENT DOCUMENTS 4,589,769 5/1986 Matsuki .
4,875,076 10/1989 Torigoe et al. ........................ 355/53

FOREIGN PATENT DOCUMENTS

| 136672 | 4/1985 | European Pat. Off. . |
|---|---|---|
| 0336537 | 10/1989 | European Pat. Off. . |
| 358521 | 3/1990 | European Pat. Off. . |
| 419240 | 3/1991 | European Pat. Off. . |
| 53-90873 | 8/1978 | Japan . |
| 6055624 | 3/1985 | Japan . |
| 62-262428 | 11/1987 | Japan . |
| 1243519 | 9/1989 | Japan . |
| 2100311 | 4/1990 | Japan . |

*Primary Examiner*—Craig E. Church
*Attorney, Agent, or Firm*—Fitzpatrick, Cella, Harper & Scinto

[57] ABSTRACT

An exposure apparatus and method for exposing a workpiece to a pattern of an original with radiation includes a masking device having movable blades for variably defining an aperture to selectively block and transmit the radiation to define on the workpiece a desired exposure zone corresponding to the aperture, the masking device having a window, and a detector for detecting the positional deviation between the original and the workpiece by using light passing through the window of the masking device.

22 Claims, 6 Drawing Sheets

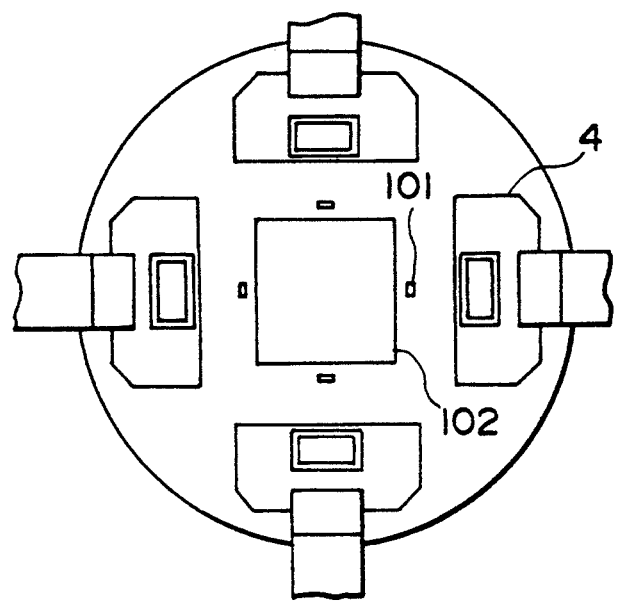
F I G. 5
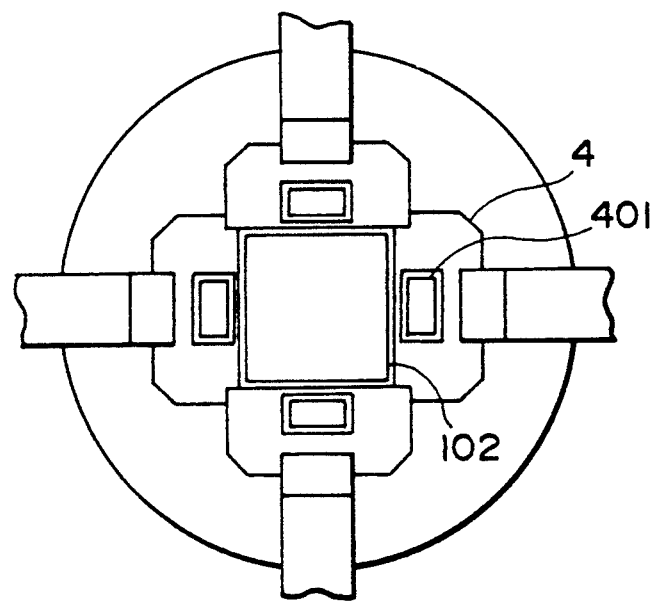
F I G. 6

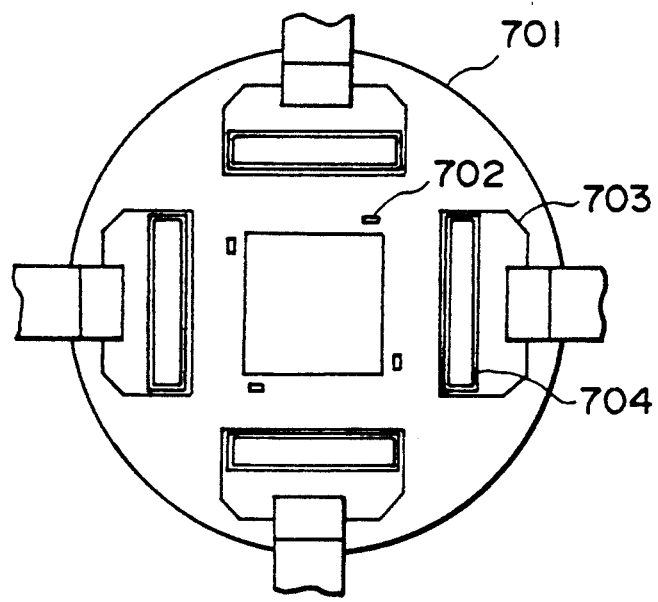
F I G. 7
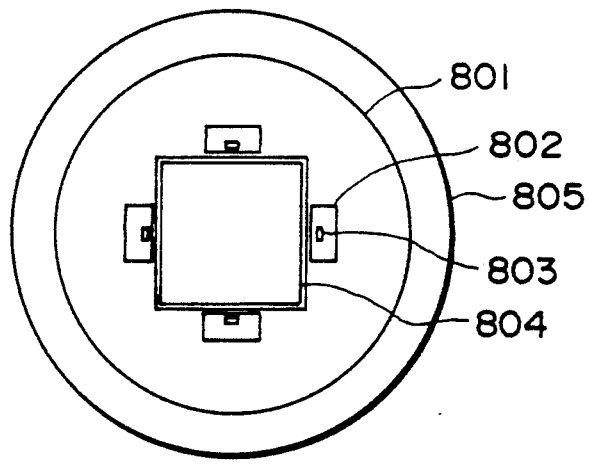
F I G. 8
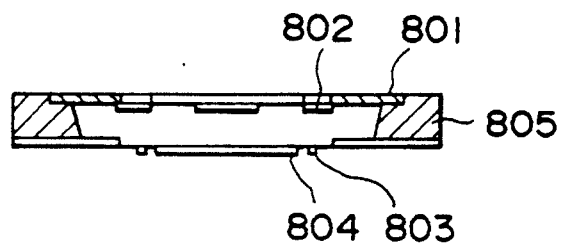
F I G. 9

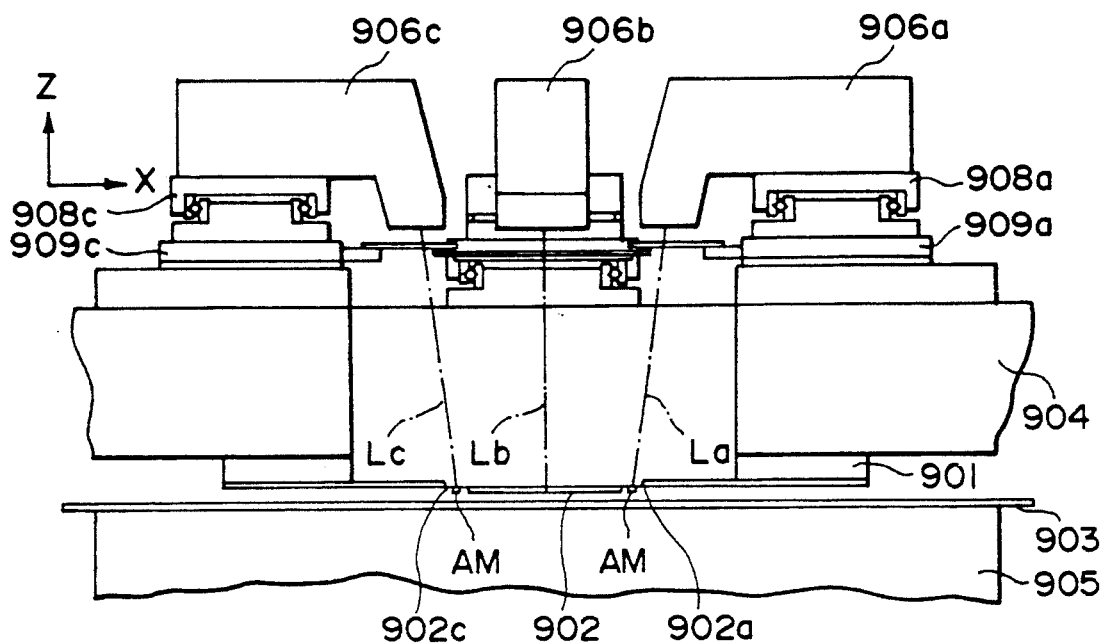
F I G. 10
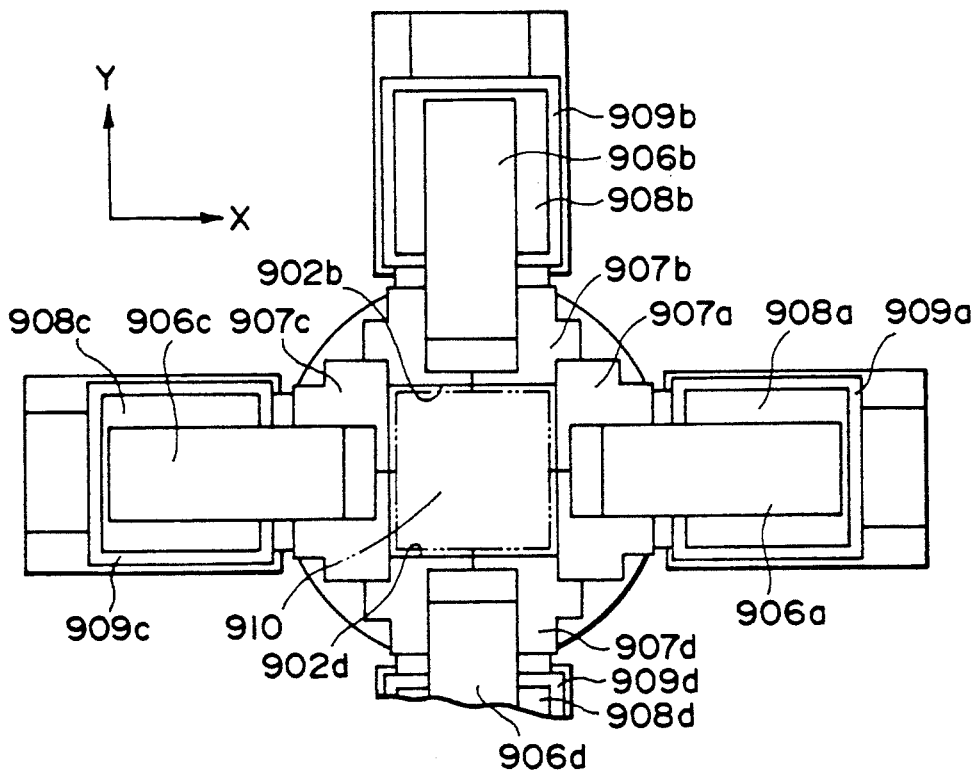
F I G. 11

EXPOSURE APPARATUS

This application is a continuation of application Ser. No. 07/662,408, filed Feb. 28, 1991, now abandoned.

FIELD OF THE INVENTION AND RELATED ART

This invention relates to an exposure view-angle limiting means suitably usable, for example, in a step-and-repeat type exposure apparatus wherein a mask and a wafer are disposed close to or in contact with each other and wherein exposures are made to divided zones on the wafer sequentially.

The manufacture of integrated circuits or semiconductor devices includes repetition of a process of optically transferring a pattern, formed on a mask, onto a wafer coated with a photosensitive material. Particularly, in consideration of the decreasing linewidth of the pattern, exposure apparatuses of the type using X-rays as an exposure light source are used.

A practical example of such X-ray exposure apparatuses is a step-and-repeat type exposure apparatus wherein the surface of one wafer is divided into plural zones so as to reduce the size of the exposure region which is an area to be exposed at once, and wherein exposures are made to the zones of the wafer while sequentially moving the wafer relative to a mask.

Such a step-and-repeat method is effective in a high-precision X-ray exposure apparatus. In this method, it is necessary to use some means for limiting the exposure region so as to prevent a neighboring portion of a wafer zone from being exposed.

Also, around a circuit pattern region of a mask, usually there are provided alignment marks for effecting alignment between a circuit pattern of the mask with a circuit pattern already formed on a wafer, and the exposure apparatus is equipped with detecting means for detecting any positional deviation of such alignment marks. In order to prevent exposure of these alignment marks, preferably an aperture means for limiting the exposure region is provided to cover the alignment marks against the exposure illumination.

SUMMARY OF THE INVENTION

The present invention, in one aspect, pertains to an exposure apparatus of the type as described above, and it is an object of the present invention to provide a structure for controlling an X-ray exposure region very precisely when the same is to be limited, without blocking path of an optical system of a positional deviation detecting system and without exposing an alignment mark on a wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5 and 6 are plan views, respectively, corresponding to those shown in FIGS. 3 and 4.

FIG. 7 is a plan view showing a major part of a second embodiment of the present invention.

FIGS. 8 and 9 are a plan view and a sectional view, showing a major part of a third embodiment of the present invention.

FIGS. 10 and 11 are a sectional view and a plan view, showing the structure of an aperture means of an X-ray aligner according to a fourth embodiment of the present invention.

DESCRIPTION OF THE PREFERRED EMBODIMENTS

Next, embodiments of the present invention will be explained in conjunction with the drawings.

Figure 1:
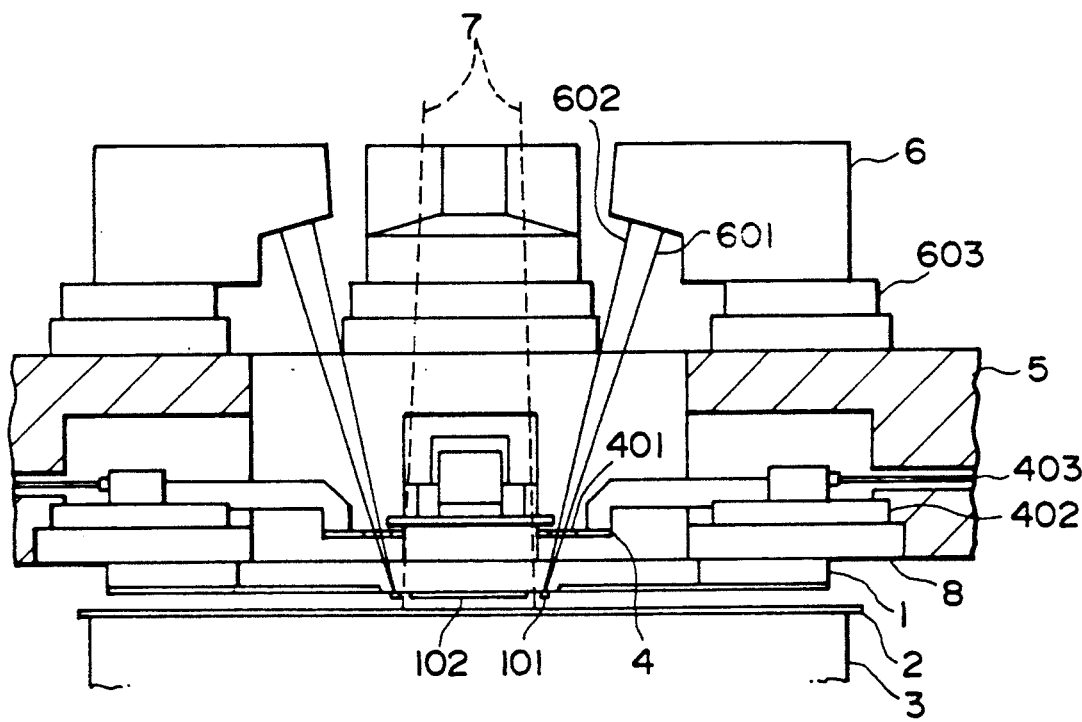
FIG. 1 is a sectional view showing a major part of a first embodiment of the present invention.

FIG. 1 is a sectional view showing the structure of a major part of a first embodiment of the present invention.

Denoted in the drawing at 4 are aperture blades (light blocking means) for limiting the exposure region. Each blade comprises a metal plate having a sufficient thickness to prevent transmission of first light, consisting of X-rays (soft X-rays) to be used for the exposure. Denoted at 402 are aperture stages for moving corresponding aperture blades 4.

Each aperture stage 402 comprises a single axis stage and is operable to set an associated aperture blade 4 at a predetermined position, corresponding to a desired view angle (range). Four aperture blades 4 and four aperture stages 402 are provided in this example, in association with the four sides of the view angle, respectively.

Driving means for the aperture stage 402 comprises a pulse motor drive or a DC motor drive with an encoder, and the quantity of movement is controlled in response to a signal supplied from a drive control (not shown).

Denoted at 6 are position detecting devices each for measuring a positional deviation between a pattern already formed on a wafer 2 and a pattern formed on a mask 1 which is held by a mask chuck 8. Generally, the positional deviation detection is effected by detecting a positional deviation of an alignment mark formed at a peripheral part around the circuit pattern.

The mask-to-wafer alignment to be effected in this embodiment may be made in a manner such as disclosed in Japanese Laid-Open Patent Application No. 100311/1990 or European Patent Application No. EPA 0,336,537. More specifically, it may be effected by detecting positional deviations between alignment marks (not shown) on the wafer 2 and alignment marks 101 formed around the circuit pattern area 102 on the mask 1. In consideration of a possibility that each positional deviation detecting means is able to detect a positional deviation only in one direction, four positional deviation detecting devices 6—6 are provided in this example. These positional deviation detecting devices 6—6 correspond to four alignment marks 101, respectively, formed at four peripheral sides of the circuit pattern area 102.

Denoted at 601 is the axis of emission for a laser beam to be projected from a corresponding positional deviation detecting device 6, for obtaining a positional deviation detection signal. The laser beam is emitted by a laser light source (not shown) of a corresponding positional deviation detecting device. Denoted at 602 is the axis of light reception for the laser beam to be received by a light emitting element (optical detection means), not shown, of a corresponding positional deviation detecting device 6, after the laser beam is influenced by an alignment mark 101 on the mask substrate and an alignment mark (not shown) on the wafer such that it bears a positional deviation signal, representing mutual positional deviation of these alignment marks.

In order to obtain a positional deviation signal with good precision, the emitted laser beam should be projected on the alignment mark 101 with a predetermined positional precision.

The size of the circuit pattern area 102 is variable with cases, and the disposition of the alignment mark 101 is variable with masks. In consideration of this, the positional deviation detecting device 6 is equipped with a stage 603 which is movable in two directions, whereby an alignment mark, if it is in a predetermined region, can be caught by the positional deviation detecting device.

The stage 603, the aperture stage 402 and the mask chuck 8 are mounted on a frame 5 of the exposure apparatus. Also, broken lines 7 in FIG. 1 depict the range of projection of the exposure X-rays.

The aperture blade 4 of the present embodiment is formed with an opening for allowing passage of the laser beam projected from the positional deviation detecting device 6. The opening is covered by a plate 401 adhered thereto and made of a material which does not transmit exposure X-rays but transmits a laser beam as described above. Usable examples are X-ray resistive glasses such as BK-7R available from OHARA Inc. Japan and BK-7G25 available from JENAer GLASWERK SCHOTT & GEN. Denoted at 403 is a piping for temperature control of the aperture blade 4, through which cooling water is circulated between it and an external water tank (not shown), such that a temperature control means is constituted thereby. With this arrangement, the aperture blade 4 can be controlled always at a constant temperature.

Figure 2:
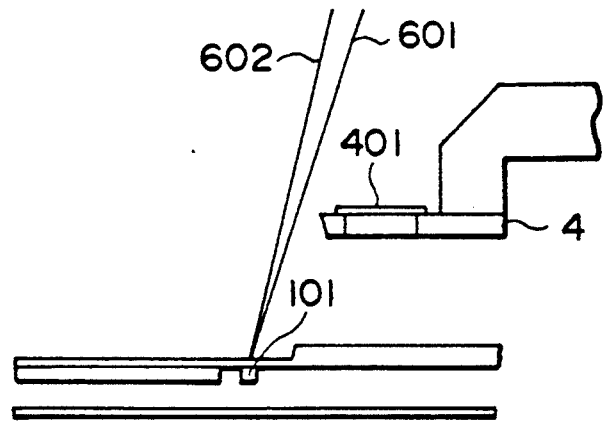
FIGS. 2–4 are sectional views, respectively, illustrating different operational states of the first embodiment.

The operation of this embodiment will be explained. FIG. 2 shows a state in which a positional deviation between the mask 1 and the wafer 2 is being detected. The aperture blade 4 is at a position sufficiently retracted from the alignment mark 101 so as not to interfere with impingement of the laser beam 601 on the alignment mark 101.

Figure 3:
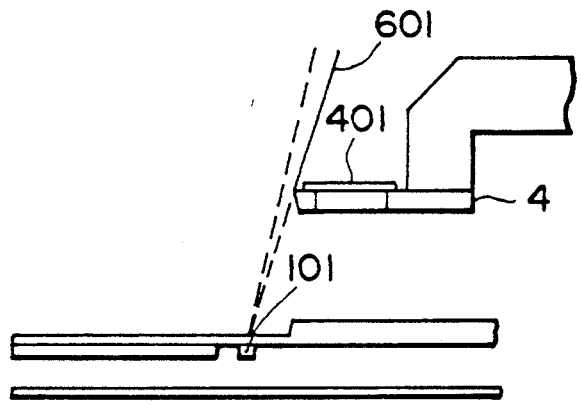

FIG. 3 shows a state in which, after completion of the mask-to-wafer alignment operation based on a positional deviation signal, the aperture blade 4 is just going to cross the path of the laser beam. FIG. 5 is a plan view corresponding to this. In the state shown in FIG. 3, the signal processing at the light receiving portion of the positional deviation detecting device 6 is set in a mode different from that for the positional deviation detection, such as a mode for discriminating presence/absence of a light reception signal, for example.

When the aperture blade 4 comes to a position covering the alignment mark 101 against the laser beam, namely, at the very moment at which the blade 4 crosses the laser beam, a corresponding signal is supplied from the signal processing portion of the positional deviation detecting device 6 to the drive control for the aperture stage 401. Namely, a signal representing the arrival of the edge of the blade at the position of the path of the laser beam, is produced and supplied. Since the position of the alignment mark with respect to the path of emitted light (axis 601) has been fixed, positional information of the aperture blade 4 with respect to the alignment mark 101 is obtained at this time.

Figure 4:
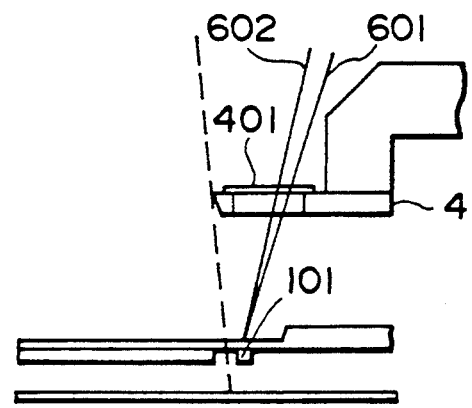

FIG. 4 shows the position of the aperture blade 4 to be assumed for the exposure (circuit pattern transfer) FIG. 6 is a plan view corresponding to this.

In this state, the aperture blade 4 is protruded as compared with the FIG. 3 state. The beam of X-rays for the exposure passes by the edge of the aperture blade 4. The aperture blade 4 covers the alignment mark 101 against the exposure X-rays 7, but it does not cover the circuit pattern area 102. Also, the laser beam from the positional deviation detecting device 6 can pass through the window 401 of the aperture blade 4 and impinge on the alignment mark 101. As a result, the circuit pattern area 102 can be exposed to the X-rays while, on the other hand, the alignment mark 101 is not exposed to the X-rays. Thus, it is still possible to effect the positional deviation detection during the exposure process.

Since the moving distance from the FIG. 3 position to the FIG. 4 position is fixed, it is possible to calculate the moving distance beforehand.

In this embodiment, in the state shown in FIG. 2, a positional deviation between the alignment mark 101 formed on the mask 1 and an alignment mark formed in a zone of a wafer 2, to be exposed at the first time, is detected and then the initial positioning is effected. After this, in the state shown in FIG. 3, signal detection is effected for the positioning of the aperture blade 4. Subsequently, the aperture blade 4 is protruded by using the detection signal to a position such as shown in FIG. 4, whereby the limitation of the exposure region for the exposure of the wafer 2, is accomplished. After this, if another zone of the wafer 2 is to be exposed, the aperture blade 4 is kept in the state shown in FIG. 4, and by using the laser beam projected through the window 401, a positional deviation between the alignment mark 101 of the mask 1 and another alignment mark formed in that exposure zone of the wafer 2 is detected and, then, the positioning is effected.

In the present embodiment, as described above, for step-and-repeat exposures, the positioning is effected by using the laser beam projected through the window 401. However, there is a possibility that, depending on the material or thickness of the plate 401, the optical path length changes largely or non-negligible refraction is caused. If this occurs, then the optical system is different between a case where the alignment laser beam passes through the window and a case where it does not pass therethrough. In order to compensate for this, the signal processing of the positional deviation detecting device 6 may be made to operate alternately in different modes for these cases, to execute positional deviation detection. For example, in the case where the laser beam goes through the window, the signal processing may be made in consideration of the effect of refraction or the like.

FIG. 7 is a plan view showing a major part of a second embodiment of the present invention.

In this embodiment, each aperture blade 703 is provided with a window 704 of a width substantially equal to the full length of a side of a maximum view angle to be defined for the exposure. This makes it possible to effect the positioning for the step-and-repeat exposures, independently of the position of each alignment mark 702 to be provided on a scribe line of a wafer 701. The remaining portion of this embodiment is similar to the first embodiment.

FIG. 8 is a plan view showing a major part of a third embodiment of the present invention, and FIG. 9 is a sectional view of the same.

In this embodiment, for simplification of structure, a single aperture member 801 is mounted on the top of a mask frame 805. The portion of the aperture member 801 corresponding to a circuit pattern area 804 defined on the mask frame 805 is shaped into a rectangular opening, and four small positioning windows each for allowing passage of a positioning laser beam are formed adjacent the centers of the four sides of the rectangular opening, respectively. Each positioning window is covered by a plate 802 adhered thereto and made of a similar material as the plate 401 of the first embodiment. The remaining portion of this embodiment is similar to the first embodiment.

In the present embodiment, the positioning laser beam can always pass through the window and, therefore, the same condition such as refraction or the like is assured. Thus, the positioning at the time of initial exposure (first shot) and the positioning at the step-and-repeat exposures, can be made in the same condition. As a result, no change occurs in the positioning reference (the position of incidence of the laser beam upon a light receiving element where there is no positional deviation) between the positioning operation at the initial exposure and the positioning operation at the step-and-repeat exposure, due to the effect of refraction of the window 802. Since in this embodiment the temperature of the aperture member 801 is not controlled, it is preferable to use a metal material having a large heat conductivity so that produced heat is easily transmitted to the mask chuck.

FIGS. 10 and 11 are a sectional view and a plan view, showing the structure of a portion around an aperture in an X-ray aligner according to a fourth embodiment of the present invention. Denoted in the drawings at 901 is a mask having a circuit pattern (exposure region) 902 to be transferred; denoted at 903 is a wafer onto which the circuit pattern of the mask is to be transferred; denoted at 904 is a base on which the mask is held fixed; denoted at 905 is a wafer chuck with which the wafer is held fixed on a wafer stage (not shown); denoted at 906a-906d are pickups each comprising a semiconductor laser for projecting light onto alignment marks AM formed on the mask and the wafer, a CCD line sensor for detecting diffraction light or the like from the alignment marks, which light contains positional deviation information and the like; and at La-Ld are paths for the alignment lights.

In this X-ray aligner, as the wafer 903 is brought to the exposure position, a positional deviation between the mask 901 and the wafer 903 with reference to a predetermined standard positional relationship is detected on the basis of the outputs from the pickups 906a-906d Then, on the basis of results of positional deviation detection, the wafer stage is driven to correct a positional deviation (gap, parallelism and the like) of the mask 901 and the wafer 903 in the Z-axis direction as well as a positional deviation of them in respect to the X, Y and $\theta$ directions. After such positional deviation correction, exposure light such as X-rays emitted from a SOR (synchrotron orbit radiation) source, for example, is projected from the above to the below in the Z direction in FIG. 10, namely, in a direction perpendicular to the sheet of the drawing of FIG. 11, whereby an image of the pattern of the mask is printed on the wafer.

Denoted at 907a-907d are light blocking plates for defining the exposure region 902. Each of these light blocking plates 907a-907d is made of a material having a sufficient thickness such that, while the laser light projected from the pickup can path therethrough, almost all the X-rays (exposure light) are blocked thereby. Denoted at 908a-908d are first stages for carrying thereon the pickups 906a-906d, respectively, each of which comprises a single-axis stage movable in a plane parallel to the exposure plane (X-Y plane) and in a direction parallel to corresponding one of the sides 902a-902d of the exposure region 902. The first movable stages 908a and 908c are movable in the Y direction, while the first movable stages 908b and 908d are movable in the X direction. Denoted at 909a-909d are second movable stages for carrying thereon the first movable stages 908a-908d, respectively, each of which comprises a single-axis stage movable in a plane parallel to the X-Y plane and in a direction perpendicular to corresponding one of the sides 902a-902d of the exposure region 2. The second movable stages 909a-909c are movable in the X direction, while the second movable stages 909b and 909d are movable in the Y direction. The first movable stage 908a and the second movable stage 909a cooperate and constitute a dual-axis stage for moving the pickup 906a in the X and Y directions. Similarly, the pair of single-axis stages 908b and 909b, the pair of the single-axis stages 908c and 909c and the pair of single-axis stages 908d and 909d, provide dual-axis stages, respectively, for moving the pickups 906b, 906c and 906d, respectively.

The light blocking plates 907a-907d are mounted on the second movable stages 909a-909d, respectively, and they are set at those positions defining the aperture 910 corresponding to the exposure region 902, prior to the X-ray exposure. Alignment marks are formed at such positions that, when the blocking plates 907a-907d are aligned with respect to the exposure region 902, the alignment marks can be detected by the pickups 906a-906d, respectively.

Figure 12:
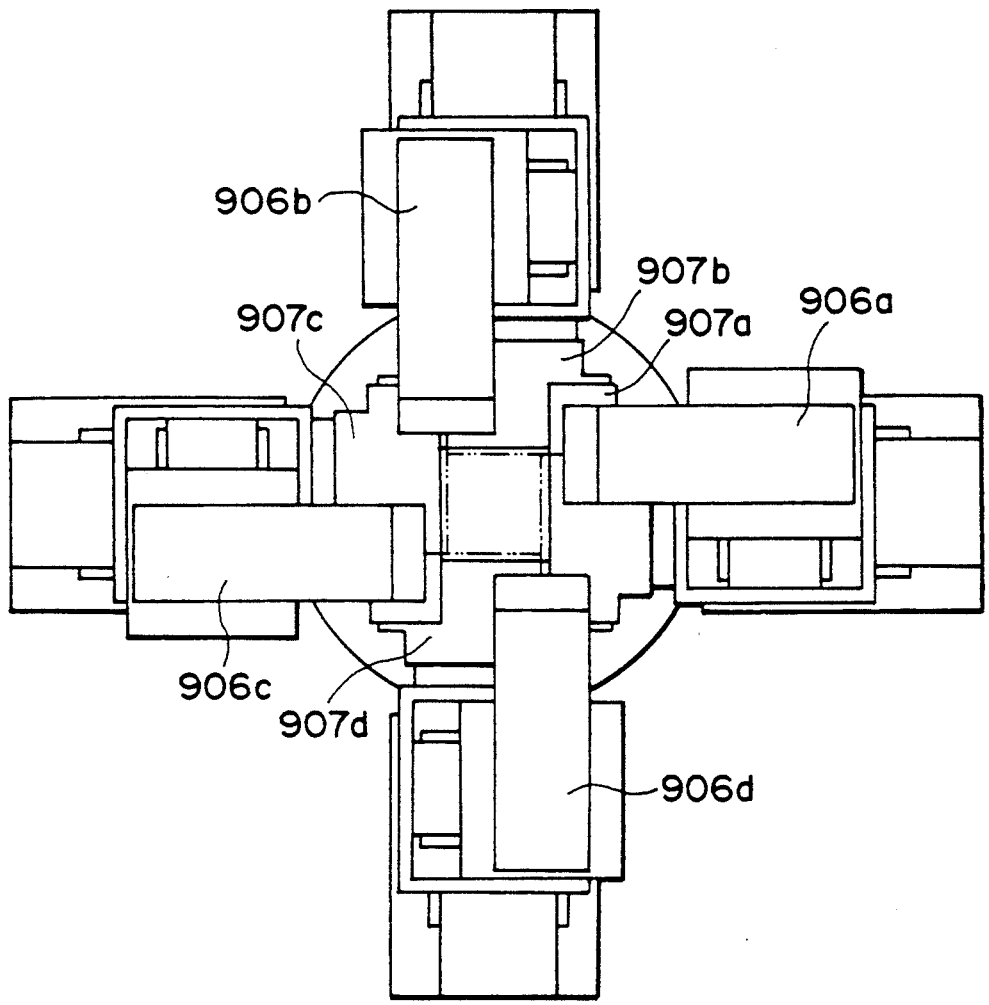
FIG. 12 is a plan view, in the case where the exposure region shown in FIG. 11 is small and alignment marks are formed at peripheral edges of the exposure region.

In this X-ray aligner, each dual-axis stage for moving corresponding one of the pickups 906a-906d, is provided by a combination of corresponding one of the single-axis stages 908a-908d each being movable in a direction (lateral direction) parallel to corresponding one of the four sides 902a-902d of the exposure region 902, with corresponding one of the single-axis stages 909a-909d each being movable in a direction (longitudinal direction) perpendicular to the corresponding one of the sides 902a-902d of the exposure region 902. Each of the single-axis stages 908a-908d is mounted on corresponding one of the single-axis stages 909a-909d, with the moving direction of each of the single-axis stages 909a-909d being confined only to the longitudinal direction. Additionally, the light blocking plates 907a-907d for defining the exposure region are mounted on the single-axis stages 909a-909d, respectively. In this manner, the stages for moving the pickups 906a-906d, respectively, are used also as the stages for moving the light blocking plates 907a-907d, respectively. This makes it possible to eliminate the necessity of using specific stage means exclusively for changing the aperture size. Also, the light blocking plates 907a-907d are mounted on the stages 909a-909d each being movable only in the longitudinal direction. This avoids the necessity of moving the stages 909a-909d and the blocking plates 907a-907d in their lateral directions even in such a case where, as shown in FIG. 12, each alignment mark is formed at an end portion of corresponding one of the sides 902a-902d of the exposure region 902 and thus the pickups 906a-906d have to be moved laterally to the end portions. Therefore, as compared with a structure wherein each light blocking plate moves laterally, the aperture device comprising the light blocking plates 907a–907d and the like can be made compact.

Further, by using, as the light blocking plates 907a–907d, such a material effective to block X-rays for the exposure but effective to transmit alignment laser light, it is possible to dispose the aperture member (blocking plates 907a–907d) between the mask 901 and the pickups 906a–906d, since the alignment light can pass through the light blocking plate. By disposing the aperture member close to the mask 901, as above, it is possible to prevent deterioration of the precision of controlling the exposure region limitation attributable to a change in the angle of incidence of the exposure X-rays or diffraction at the edges of the light blocking plates 907a–907d.

Further, when the exposure X-rays are projected, the light blocking plates 907a–907d can serve to prevent impingement of scattered X-rays from the mask 901 upon the pickups 906a–906d. Therefore, it is possible to protect the alignment system against the scattered X-rays. As a matter of course, each light blocking plate has a sufficient size so as to prevent impingement of the scattered X-rays from the mask 901 upon the pickup.

As described hereinbefore, an important feature of this embodiment resides in that the light blocking member for blocking the illumination light for the exposure, itself, dose allow passage of the illumination light for the positional deviation detection. Where the illumination light for the exposure comprises X-rays and the illumination light for the positional deviation detection comprises light such as a laser light, for example, having a wavelength longer than near-ultraviolet light, the light blocking member may be made of a material such as light transmissive ceramics such as PLZT or MgO, $Y_2O_3$, $Gd_2O_3$, etc.

While in the foregoing the invention has been described with reference to examples where the invention is applied to an X-ray exposure apparatus, the invention is applicable also to a case where ultraviolet light or any other exposure illumination light is used.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a workpiece to a pattern of an original with X-rays, said apparatus comprising:
   a masking device having a movable blade for variably defining an aperture to selectively block and transmit the X-rays to define on the workpiece a desired exposure zone corresponding to said aperture, said movable blade having a window; and
   detecting means comprising a source of alignment light for detecting a positional relationship between the original and the workpiece by using alignment light having a wavelength longer than the X-rays passing through said window of said movable blade, wherein said source of alignment light is displaced with said movable blade.

2. An apparatus according to claim 1, wherein said movable blade blocks the X-rays.

3. An apparatus according to claim 1, wherein the alignment light comprises a laser beam.

4. An apparatus according to claim 1, wherein said window is made of a material effective to block the X-rays and to transmit the light, and wherein said detecting means projects the alignment light through said window to detect the positional relationship.

5. An apparatus according to claim 1, wherein said movable blade has as portion made of a metal, and wherein said apparatus further comprises temperature control means for controlling temperature of said metal portion.

6. An apparatus according to claim 1, further comprising position control means for controlling a position of said movable blade on the basis of detection by said detecting means.

7. An apparatus according to claim 1, further comprising moving means for moving the workpiece relative to the original, wherein said moving means is operable to move the workpiece so as to sequentially bring different portions of the workpiece to a position below the original to effect step-and-repeat exposures.

8. An apparatus according to claim 1, wherein said masking device is four movable blades corresponding to four sides of the exposure zone, each being movable rectilinearly and reciprocatingly.

9. An apparatus according to claim 1, wherein said detecting means optically detects the positional relationship between an alignment mark provided on the workpiece and an alignment mark provided outside of the exposure zone on the original.

10. An apparatus according to claim 1, wherein said movable blade is made of a material effective to block the X-rays but to transmit the second alignment light.

11. An apparatus according to claim 1, wherein said movable blade is disposed between said detecting means and the workpiece, with respect to a path of the X-rays.

12. An exposure method for exposing a workpiece to a pattern of an original with X-rays, said method comprising the steps of:
   providing a masking device having a movable blade for variably defining an aperture to selectively block and transmit the X-rays to define on the workpiece a desired exposure zone corresponding to the aperture, wherein said movable blade has a window;
   positioning the movable blade to set the aperture to be used for the exposure of the workpiece;
   detecting a positional relationship between the original and the workpiece by using alignment light having a wavelength longer than the X-rays passing through the window of the movable blade, wherein a source of the alignment light is displaced with the movable blade; and
   exposing a zone of the workpiece corresponding to the set aperture of the masking device with the X-rays passing through the set aperture.

13. A method according to claim 12, wherein the alignment light comprises a laser beam.

14. A method according to claim 12, wherein the positional deviation is detected by projecting the alignment light through a portion of the blocking member which portion is effective to block the X-rays but to transmit light.

15. A method according to claim 11, wherein the movable blade is disposed between the workpiece and detecting means provided for said detection, with respect to a path of the X-rays.

16. An exposure apparatus for exposing a workpiece to a pattern of an original with X-rays, said apparatus comprising:
   a masking device having a movable blade for variably defining an aperture to selectively block and transmit the X-rays to define on the workpiece a desire exposure zone corresponding to the aperture, said movable blade having a window;
   a light source for providing alignment light having a wavelength longer than the X-rays, for detection of a positional relationship between the original and the workpiece, wherein said source of alignment light is displaced with said movable blade; and
   a detector for receiving the alignment light provided by said light source and passing through said window of said movable blade, to detect the positional relationship between the original and the workpiece;
   wherein said movable blade is disposed between the workpiece and said detector with respect to a path of the X-rays.

17. An apparatus according to claim 16, wherein the alignment light comprises a laser beam.

18. An apparatus according to claim 16, wherein said movable blade is made of a material effective to block the X-rays but to transmit the second light.

19. An apparatus according to claim 15, wherein said movable blades have a portion made of a material effective to block the X-rays but to transmit the light, wherein said light source projects the alignment light through the window while the detector receives the light passing through said window.

20. An apparatus according to claim 16, wherein said movable blades block the X-rays.

21. A method of manufacturing semiconductor devices by exposing a workpiece to a pattern of an original with X-rays, said method comprising the steps of:
   providing a masking device having a movable blade for variably defining an aperture to selectively block and transmit the X-rays to define on the workpiece a desired exposure zone corresponding to the aperture, wherein the movable blade has a window;
   positioning the movable blade to set the aperture to be used for the exposure of the workpiece;
   detecting a positional deviation between the original and the workpiece by using alignment light having a wavelength longer than the X-rays, passing through the window of the movable blade, wherein a source of the alignment light is displaced with the movable blade; and
   exposing a zone of the workpiece corresponding to the set aperture of the masking device, with the X-rays passed through the set aperture.

22. A method according to claim 21, wherein said movable blade providing step comprises the step of disposing the masking device between the workpiece and a detecting means provided for said detection, with respect to a path of the X-rays.

* * * * *

UNITED STATES PATENT AND TRADEMARK OFFICE
CERTIFICATE OF CORRECTION

PATENT NO. : 5,317,615
DATED : May 31, 1994
INVENTOR(S) : RYUICHI EBINUMA, ET AL.

It is certified that error appears in the above-indentified patent and that said Letters Patent is hereby corrected as shown below:

COVER PAGE

[75] INVENTORS

", all of" (first occurrence) should be deleted; and "Nakamachi;" should read --Tokyo;--.

[56] REFERENCES CITED

FOREIGN PATENT DOCUMENTS

"6055624 3/1985 Japan" should read --60-55624 3/1985 Japan--; "1243519 9/1989 Japan" should read --1-243519 9/1989 Japan--; and "2100311 4/1990 Japan" should read --2-100311 4/1990 Japan--.

COLUMN 1

Line 51, "path" should read --the path--.

COLUMN 7

Line 29, "dose" should read --does--.

UNITED STATES PATENT AND TRADEMARK OFFICE
CERTIFICATE OF CORRECTION

PATENT NO. : 5,317,615

DATED : May 31, 1994

INVENTOR(S) : RYUICHI EBINUMA, ET AL.

Page 2 of 3

It is certified that error appears in the above-indentified patent and that said Letters Patent is hereby corrected as shown below:

COLUMN 8

Line 22, "is" should read --comprises--.
Line 32, "second" should be deleted.
Line 65, "claim 11," should read --claim 12--.

COLUMN 9

Line 6, "desire" should read --desired--.
Line 27, "second" should read --alignment--.
Line 28, "claim 15," should read --claim 16,--.
Line 29, "blades have" should read --blade has--.

UNITED STATES PATENT AND TRADEMARK OFFICE
CERTIFICATE OF CORRECTION

PATENT NO. : 5,317,615
DATED : May 31, 1994
INVENTOR(S) : RYUICHI EBINUMA, ET AL.

It is certified that error appears in the above-indentified patent and that said Letters Patent is hereby corrected as shown below:

COLUMN 10

Line 4, "blades block" should read --blade blocks--.
Line 27, "masking device" should read
   --moveable blade--.

Signed and Sealed this

Eighth Day of November, 1994

*Attest:*

BRUCE LEHMAN

*Attesting Officer*     *Commissioner of Patents and Trademarks*